(12) United States Patent
Kim

(10) Patent No.: US 7,435,616 B2
(45) Date of Patent: Oct. 14, 2008

(54) CMOS IMAGE SENSOR AND METHOD OF FABRICATING THE SAME

(75) Inventor: Yeong Sil Kim, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/609,990

(22) Filed: Dec. 13, 2006

(65) Prior Publication Data

US 2007/0145608 A1 Jun. 28, 2007

(30) Foreign Application Priority Data

Dec. 28, 2005 (KR) .................. 10-2005-0132783

(51) Int. Cl.
*H01L 21/00* (2006.01)
(52) U.S. Cl. .................. 438/70; 438/710; 257/432; 257/E31.121
(58) Field of Classification Search .............. 438/709, 438/710, 70; 257/E31.121
See application file for complete search history.

(56) References Cited

U.S. PATENT DOCUMENTS

2006/0046341 A1* 3/2006 Joon .................. 438/70

FOREIGN PATENT DOCUMENTS

| KR | 10-1999-0003621 | 9/2000 |
| KR | 10-2002-0013804 | 9/2003 |

OTHER PUBLICATIONS

Hart et al., Intorduction of Chemical Downstream Etch Techonolgy into a Mature Manufacturing Environment, IEEE/SEMI Advanced Semiconductor Manufacturing Conference, 1996, pp. 317-320.*

* cited by examiner

*Primary Examiner*—David Vu
*Assistant Examiner*—Earl N Taylor
(74) *Attorney, Agent, or Firm*—Saliwanchik, Lloyd & Saliwanchik

(57) ABSTRACT

Provided is a method of fabricating a CMOS image sensor. According to an embodiment method, an insulating layer can be formed on a semiconductor substrate, and a metal pad can be formed on the insulating layer. A first overcoat layer can be formed on the insulating layer including the metal pad. The first overcoat layer can be selectively removed to expose a portion of the metal pad. A protective layer can be formed on the exposed metal pad and the first overcoat layer. A color filter array can be formed on the protective layer, and a second overcoat layer can be formed on the color filter array and the protective layer. The second overcoat layer can be selectively removed to remain on a photodiode region. A plasma treatment can then be performed on the remaining second overcoat layer before forming a microlens.

13 Claims, 4 Drawing Sheets

CMOS IMAGE SENSOR AND METHOD OF FABRICATING THE SAME

RELATED APPLICATION(S)

This application claims the benefit, under 35 U.S.C. §119 (e), of Korean Patent Application No. 10-2005-0132783 filed Dec. 28, 2005, which is incorporated herein by reference in its entirety.

FIELD OF THE INVENTION

The present invention relates to a method of fabricating a CMOS image sensor.

BACKGROUND OF THE INVENTION

The complementary metal-oxide-semiconductor (CMOS) image sensor has been recently in the limelight as the next generation image sensor to overcome drawbacks of charged coupled device (CCD) image sensors.

The CMOS image sensor employs a switching method incorporating MOS transistors in unit pixels formed using CMOS technology. A control circuit and a signal processing circuit are used as peripheral circuits and the output of each unit pixel is sequentially detected using the MOS transistors.

That is, the CMOS image sensor reproduces an image by incorporating a photodiode and a MOS transistor in a unit pixel and sequentially detecting an electrical signal of each unit pixel using the switching method.

The CMOS image sensor uses CMOS fabrication technology, and thus has advantages such as low power consumption, a simple fabrication process due to the small number of photolithography processes, etc.

In addition, since the CMOS image sensor can integrate a control circuit, a signal processing circuit, an analog/digital converter circuit, etc. onto a CMOS image sensor chip, it is easy to miniaturize products employing the CMOS image sensor. Accordingly, the CMOS image sensor has been widely used for various products such as a digital still camera and a digital video camera.

FIGS. 1A to 1C are sectional views illustrating a method of fabricating a CMOS image sensor according to a related art.

Referring to FIG. 1A, an insulating layer 101 (for example, an oxide layer) such as for a gate insulating layer or an interlayer insulating layer is formed on a semiconductor substrate 100, and a metal pad 102 for each signal line is formed on the insulating layer 101.

Next, a first overcoat layer 103 is formed on an entire surface of the semiconductor substrate 100 including the metal pad 102, and then a surface of the first overcoat layer 103 is planarized using a chemical mechanical planarization (CMP) process.

Then, a photoresist pattern (not shown) that exposes a portion of the first overcoat layer 103 corresponding to the metal pad 102 is formed on the first overcoat layer 103, and then the first overcoat layer 103 is selectively etched using the photoresist pattern as a mask to expose a surface of the metal pad 102.

Next, a protective layer 104 is formed on an entire surface of the semiconductor substrate including the metal pad 102. The protective layer 104 is formed of an oxide layer or a nitride layer. Also, the protective layer 104 is formed to a thickness of approximately 300-800 Å. The protective layer 104 prevents damage of the metal pad 102 caused by exposing the metal pad 102 to a developing solution during photolithography processes to be performed later.

Then, a color filter resist layer (not shown) is formed on a portion of the protective layer 104 corresponding to a photodiode, and then exposure and developing processes are repeatedly performed to sequentially form red, green, and blue color filters. Such color filters constitute a color filter array 105.

Next, a second overcoat layer 106 is formed on an entire surface of the semiconductor substrate 100 including the color filter array 105, and then is selectively removed except for the portion of the second overcoat layer 106 formed on the photodiode region.

Referring to FIG. 1B, a portion of the protective layer 104 is etched using a reactive ion etch (RIE) method. That is, the protective layer 104 is selectively removed such that the portion of the protective layer 104 located under the color filter array 105 remains.

Here, the second overcoat layer 106 is partially etched due to damage incurred during the etching of the protective layer 104, and thereby creating height differences on the damaged second overcoat layer 106a that is partially etched.

Referring to FIG. 1C, microlenses 107 are formed on the damaged second overcoat layer 106a having the height differences.

However, the height differences of the damaged second overcoat layer 106a change a focal distance of the microlenses 107 and generate a partial difference in thicknesses of the microlenses 107. In addition, this affects topology of the microlenses 107 and the gaps between the microlenses 107, and eventually degrades the electrical characteristic of the CMOS image sensor.

Also, since a surface of the metal pad 102 is exposed after removing the portion of the protective layer 104, the metal pad 102 is exposed to a developing solution during a photolithography process for forming the microlenses 107. The developing solution chemically attacks the metal pad 102, thereby causing a failure or generating a metal piece from the chemically attacked metal pad 102 in the probe test.

The metal piece generated from the metal pad 102 in the probe test may be transferred to the microlenses 107 during the sawing process. The metal piece may then shield or reflect a light incident to the photodiode, which leads to noise generation and defects.

BRIEF SUMMARY

Accordingly, embodiments of the present invention are directed to a method of fabricating a CMOS image sensor that substantially obviates one or more problems due to limitations and disadvantages of the related art.

An object of embodiments of the present invention is to provide a CMOS image sensor capable of minimizing damage of a metal pad, and where the CMOS image sensor has an excellent adhesion between an overcoat layer and microlenses formed thereon and improved gap uniformity between the microlenses.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of fabricating a CMOS image sensor, the method including: forming an insulating layer on a semiconductor substrate; forming a metal pad on the insulating layer; forming a first overcoat layer on the insulating layer including the metal pad; selectively removing the first overcoat layer to expose a portion of the metal pad; forming a protective layer on the exposed metal pad and the first overcoat layer; forming a color filter array on the protective layer; forming a second overcoat layer on the color filter array and the protective layer; selectively removing the second overcoat layer to remain on a photodiode region; and performing a plasma treatment on the remaining second overcoat layer.

In another aspect of the present invention, there is provided a CMOS image sensor, including: an insulating layer formed on a semiconductor substrate; a metal pad formed on the insulating layer; a first overcoat layer formed on the insulating layer exposing a portion of the metal pad; a protective layer formed on the first overcoat layer; a color filter array formed on the protective layer; a second overcoat layer formed on the color filter array and having a plasma-treated surface; and a microlens formed on the second overcoat layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, a CMOS image sensor according to a preferred embodiment of the present invention will now be described with reference to the accompanying drawings.

FIGS. 2A to 2D are sectional views illustrating a CMOS image sensor according to an embodiment of the present invention.

Figure 1A:
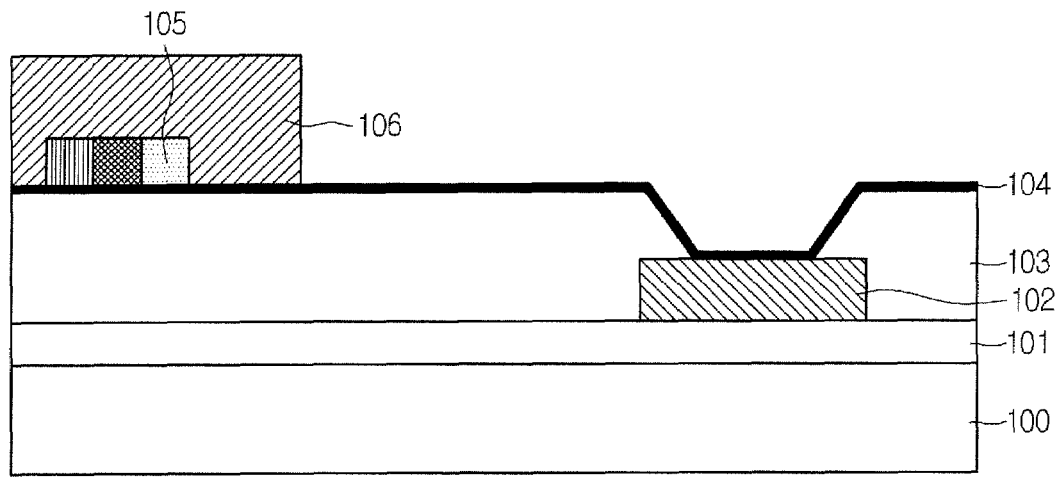
FIGS. 1A to 1C are sectional views illustrating a method of fabricating a CMOS image sensor according to a related art.
Figure 1B:
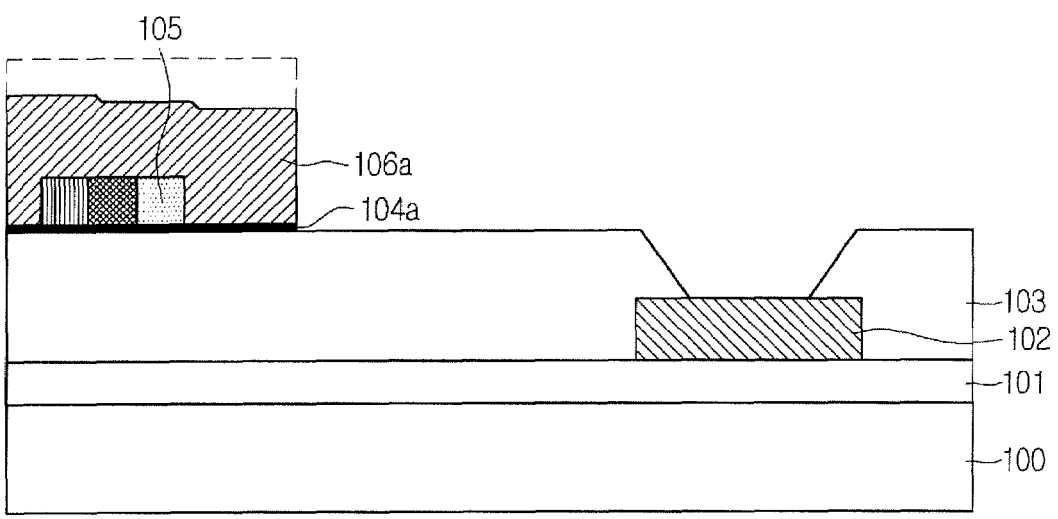
Figure 1C:
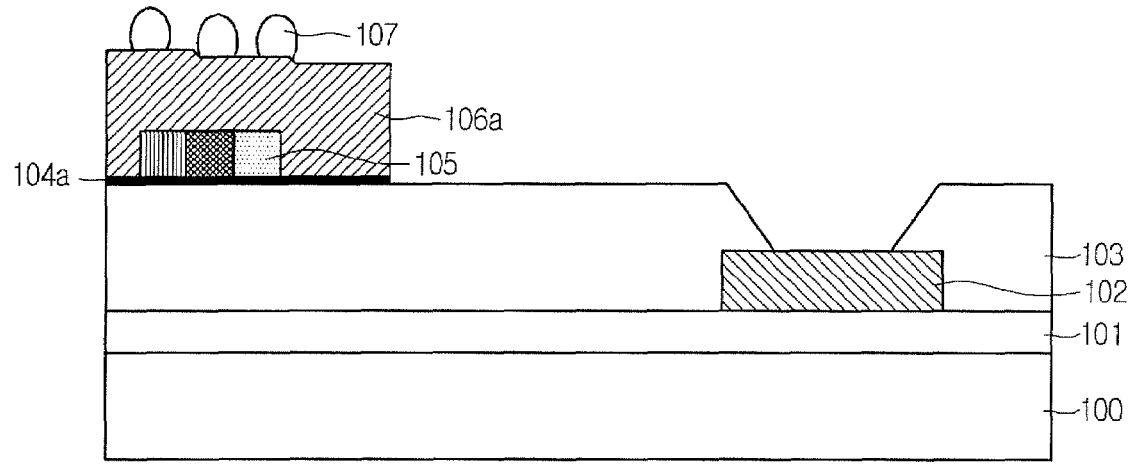
Figure 2A:
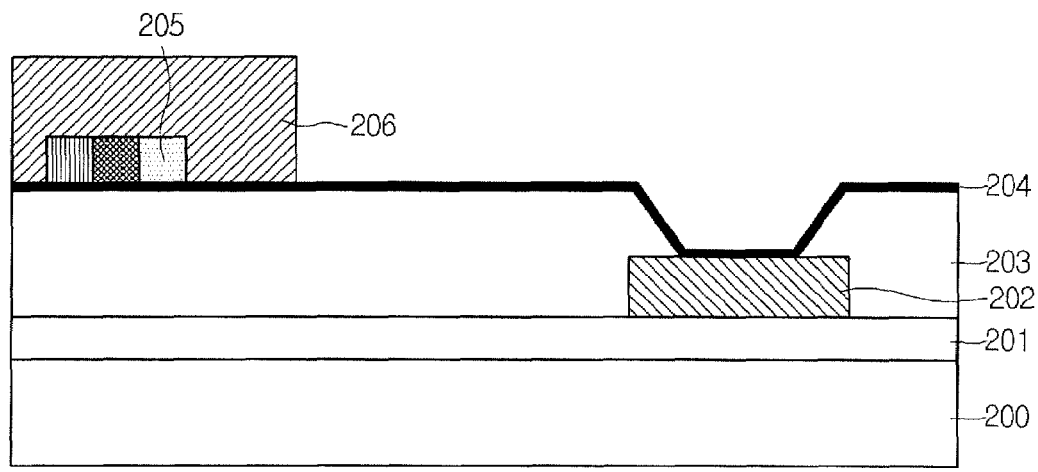
FIGS. 2A to 2D are sectional views illustrating a CMOS image sensor according to an embodiment of the present invention.

Referring to FIG. 2A, an insulating layer 201 can be formed on a semiconductor substrate 200, and a metal pad 202 for each signal line can be formed on the insulating layer 201. In one embodiment the insulating layer can be an oxide layer or a nitride layer.

The metal pad 202 may be formed of the same material as a gate electrode (not shown) on the same layer as a layer where the gate electrode is formed, and alternatively, may be formed of a different material on a different layer and connected through a separate contact. In an embodiment, the metal pad 202 may be formed of aluminum (Al).

A UV/ozone treatment or a surface treatment with a synthetic solution can be performed on a surface of the metal pad 202 in order to increase the corrosion resistance of a metal pad 202 formed of Al for a subsequent process.

Next, a first overcoat layer 203 can be formed on the semiconductor substrate 200 including the metal pad 202, and then a surface of the first overcoat layer 203 can be planarized using a CMP process.

The first overcoat layer 203 is planarized because if a lower layer has a height difference, the non-uniformity of a coating thickness may cause discoloration of the coating in a number of subsequent photolithography processes.

In an image sensor, the non-uniformity of thickness of a resist and discoloration may make transmitted light non-uniform and makes the operation of a photodiode unstable, eventually decreasing the reliability of a product employing the image sensor.

Next, a photoresist pattern (not shown) can be applied to expose a portion of the first overcoat layer 203 corresponding to the metal pad 202. The first overcoat layer 203 can be selectively etched using the photoresist pattern as a mask to expose a portion of the metal pad 202.

A protective layer 204 can be formed on an entire surface of the semiconductor substrate 200 including the metal pad 202. The protective layer 204 may be formed of an oxide layer or a nitride layer.

The protective layer 204 can be formed to a thickness of approximately 300-800 Å. The protective layer 204 can prevent damage of the metal pad 202 caused by exposing the metal pad 202 to a developing solution during subsequent photolithography processes.

Then, a color filter resist layer (not shown) can be formed on a portion of the protective layer 204 corresponding to a photodiode, and then exposure and developing processes can be repeatedly performed to sequentially form color filters such as red, green, and blue color filters.

Such color filters constitute a color filter array 205.

The color filter array 205 is formed on a photodiode region of the semiconductor substrate 200.

Next, a second overcoat layer 206 can be formed on an entire surface of the semiconductor substrate 200 including the color filter array 205, and then can be selectively removed except for the portion of the second overcoat layer 206 formed on the photodiode region.

Figure 2B:
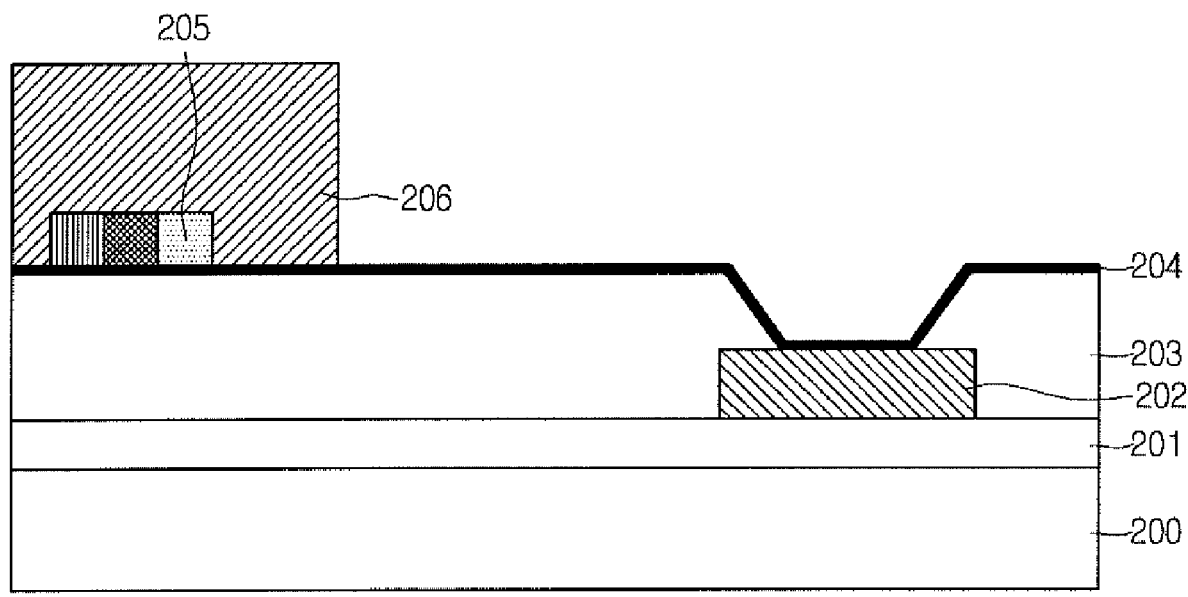

Referring to FIG. 2B, a plasma surface treatment can be performed on the remaining second overcoat layer 206.

In one embodiment, a chemical downstream etch (CDE) method may be used for the plasma surface treatment.

In the CDE method, plasma etchant formed outside a chamber flows into the chamber. In contrast, in the RIE method, plasma etchant is formed and maintained within the chamber.

The CDE method has the advantage that plasma damage due to build-up of ions or electrons is generated less, because plasma is formed outside a chamber.

According to a specific embodiment of the present invention, the plasma surface treatment can be performed using 480 sccm of $O_2$ and 80 sccm of $N_2$ as a plasma source in the condition of pressure of 50 Pa and 700 W of energy. Since it is difficult to maintain plasma when only $O_2$ is used as a plasma source, a small amount of $N_2$ may be added so as to obtain stable plasma.

The plasma surface treatment may be performed at a room temperature of 25° C. in order to minimize ashing due to the surface treatment.

According to embodiments, since the second overcoat layer 206 does not get damaged, a height difference is not created. Therefore, a focal distance and a gap between microlenses may be maintained constant during a process for forming microlenses, and thus realizing stable microlenses.

In addition, the protective layer 204 is maintained on the metal pad 202 even after the plasma surface treatment, preventing a chemical damage of the metal pad 202 during a process for forming the microlenses.

Figure 2C:
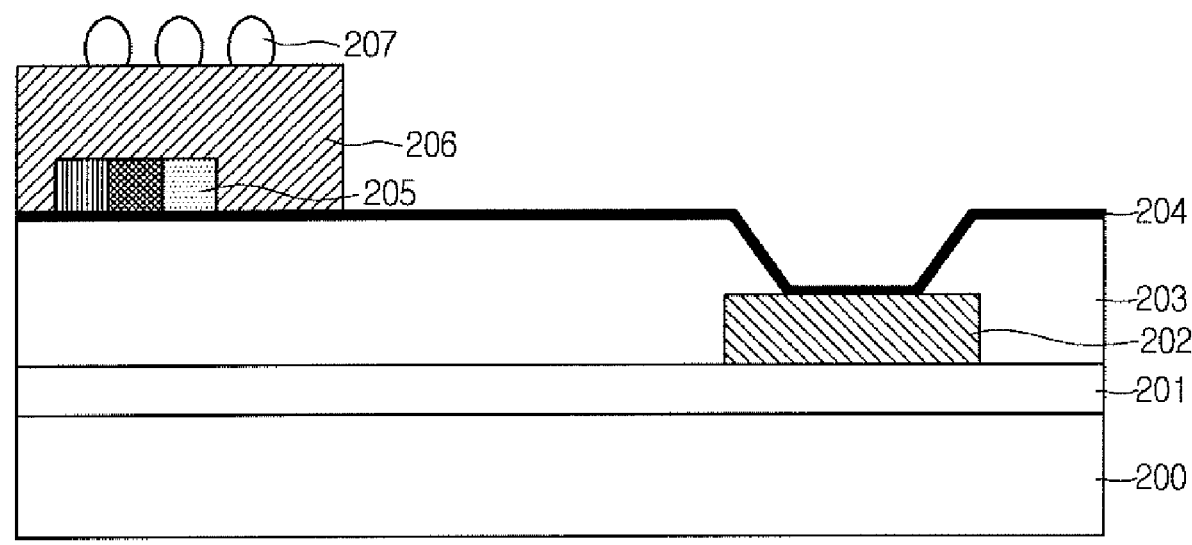

Referring to FIG. 2C, a photoresist microlens pattern layer (not shown) can be formed on the second overcoat layer 206 having the plasma surface treatment to correspond to the color filter array 205. Next a reflow process can be performed on the photoresist microlens pattern layer to form microlenses 207.

As described above, since the second overcoat layer 206 does not have a height difference, the adhesion is excellent between the microlenses 207 and the second overcoat layer 206. Further, the gap uniformity between the microlenses 207 is greatly improved.

Figure 2D:
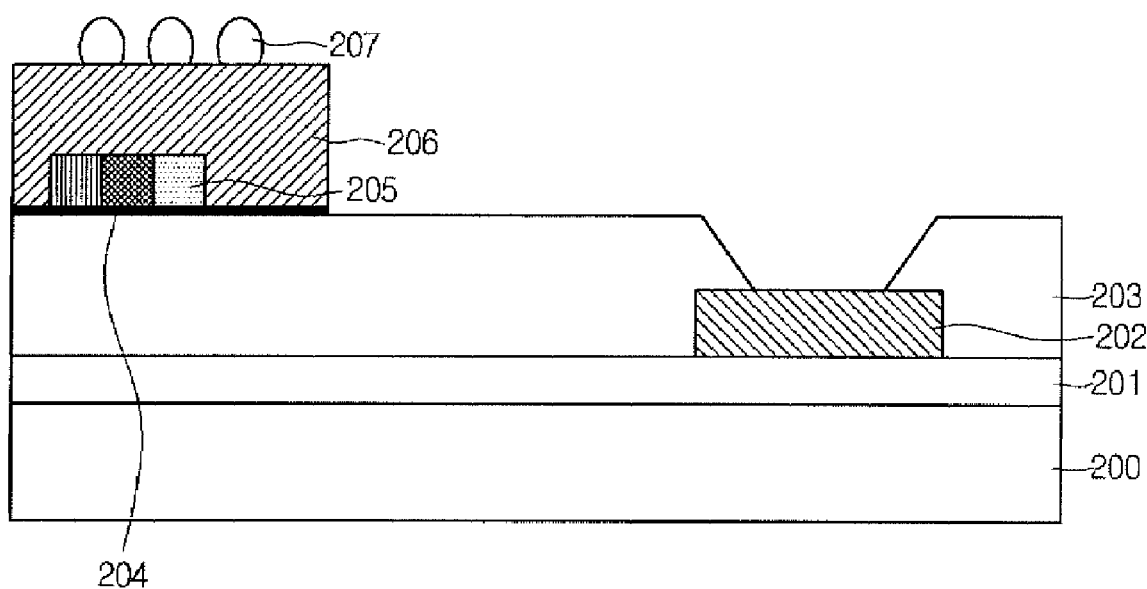

Referring to FIG. 2D, the protective layer 204 formed on the metal pad 202 can be selectively removed to expose a surface of the metal pad 202. In one embodiment, a CDE method can be used for selectively removing the protective layer 204.

According to a specific embodiment of the present invention, the protective layer 204 can be selectively removed using 480 sccm of $O_2$ and 350 sccm of $CF_4$ as a plasma source in the condition of a temperature of 25° C., pressure of 50 Pa, and 700 W of energy. Such an etching condition may provide a proper etching speed and improve the gap uniformity of the microlenses.

The CMOS image sensor according to embodiments of the subject invention has the following advantages.

Since a plasma surface treatment is performed on a second overcoat layer formed on a color filter array, an excellent adhesion can be obtained between the second overcoat layer and microlenses formed on the second overcoat layer.

Also, the plasma surface treatment performed on the second overcoat layer does not accompany etching, and thus does not create a height difference on the second overcoat layer. Therefore, the gap uniformity of the microlenses formed on the second overcoat layer is improved, and thus greatly improving the reliability of a device.

In addition, the protective layer on a metal pad is not removed in performing the plasma surface treatment on the second overcoat layer, thereby preventing a chemical damage of the metal pad during a microlens forming process.

It will be apparent to those skilled in the art that various modifications and variations can be made in the present invention. Thus, it is intended that the present invention covers the modifications and variation of this invention provided they come within the scope of the appended claims and their equivalents.

I claim:

1. A method of fabricating a complementary metal-oxide-semiconductor image sensor, the method comprising:
    forming an insulating layer on a semiconductor substrate;
    forming a metal pad on the insulating layer;
    forming a first overcoat layer on the insulating layer including the metal pad;
    selectively removing the first overcoat layer to expose a portion of the metal pad;
    forming a protective layer on the exposed metal pad and the first overcoat layer;
    forming a color filter array on the protective layer;
    forming a second overcoat layer on the color filter array and the protective layer;
    selectively removing the second overcoat layer to remain on a photodiode region;
    performing a plasma surface treatment to the remaining second overcoat layer;
    forming a microlens on the plasma-surface-treated second overcoat layer; and
    selectively etching the protective layer to expose a surface of the metal pad after forming the microlens.

2. The method according to claim 1, wherein performing the plasma surface treatment comprises using a chemical downstream etch method.

3. The method according to claim 2, wherein the plasma surface treatment using the chemical downstream etch method uses $O_2$ and $N_2$ as a source.

4. The method according to claim 3, wherein the plasma surface treatment using the chemical downstream etch method uses 480 sccm of $O_2$ and 80 sccm of $N_2$.

5. The method according to claim 2, wherein the plasma surface treatment using the chemical downstream etch method is performed in the condition of pressure of 50 Pa and 700 W of energy.

6. The method according to claim 2, wherein the plasma surface treatment using the chemical downstream etch method is performed at a room temperature of 25° C.

7. The method according to claim 1, wherein selectively etching the protective layer comprises using a chemical downstream etch method.

8. The method according to claim 7, wherein the selective etching using the chemical downstream etch method uses $O_2$ and $CF_4$ as a source.

9. The method according to claim 8, wherein the selective etching using the chemical downstream etch method uses 480 sccm of $O_2$ and 350 sccm of $CF_4$.

10. method according to claim 7, wherein the selective etching using the chemical downstream etch method is performed in the condition of pressure of 50 Pa and 700 W of energy.

11. The method according to claim 7, wherein the selective etching using the chemical downstream etch method is performed at a room temperature of 25° C.

12. The method according to claim 1, wherein the metal pad is formed of Al.

13. The method according to claim 1, wherein the protective layer is an oxide layer or a nitride layer.

* * * * *